(12) United States Patent
Dickerson et al.

(10) Patent No.: US 9,979,406 B2
(45) Date of Patent: May 22, 2018

(54) HIGH-RELIABILITY HOLDOVER METHOD AND TOPOLOGIES

(71) Applicant: Arbiter Systems, Incorporated, Paso Robles, CA (US)

(72) Inventors: William J. Dickerson, Cranbrook (CA); Robert T. Dickerson, Paso Robles, CA (US)

(73) Assignee: Arbiter Systems, Incorporated, Paso Robles, CA (US)

( * ) Notice: Subject to any disclaimer, the term of this patent is extended or adjusted under 35 U.S.C. 154(b) by 198 days.

(21) Appl. No.: 15/156,310

(22) Filed: May 16, 2016

(65) Prior Publication Data

US 2016/0261275 A1 Sep. 8, 2016

Related U.S. Application Data

(63) Continuation of application No. 14/626,767, filed on Feb. 19, 2015, now Pat. No. 9,362,926.

(Continued)

(51) Int. Cl.
| | |
|---|---|
| *H03L 7/085* | (2006.01) |
| *H03L 7/099* | (2006.01) |
| *H03L 7/183* | (2006.01) |
| *H03L 7/18* | (2006.01) |
| *H03L 7/26* | (2006.01) |
| *H03L 7/089* | (2006.01) |
| *H03L 7/23* | (2006.01) |
| *H03B 5/36* | (2006.01) |
| *H03L 7/197* | (2006.01) |

(52) U.S. Cl.
CPC ............... *H03L 7/099* (2013.01); *H03B 5/36* (2013.01); *H03L 7/0891* (2013.01); *H03L 7/18* (2013.01); *H03L 7/183* (2013.01); *H03L 7/197* (2013.01); *H03L 7/23* (2013.01); *H03L 7/26* (2013.01)

(58) Field of Classification Search
CPC . H03L 7/099; H03L 7/183; H03L 7/18; H03L 7/26; H03L 7/0891; H03L 7/23; H03B 5/36
USPC .................. 331/2, 18, 34, 16, 158; 327/156; 455/260; 375/376
See application file for complete search history.

(56) References Cited

U.S. PATENT DOCUMENTS

| | | | |
|---|---|---|---|
| 4,849,993 | A | 7/1989 | Johnson |
| 7,064,619 | B1 | 6/2006 | Meyer |

(Continued)

OTHER PUBLICATIONS

Analog Devices; MT-086 Tutorial; "Fundamentals of Phase Locked Loops (PLLs)"; Rev. 0, Oct. 2008; 10 pages.

(Continued)

*Primary Examiner* — Arnold Kinkead
(74) *Attorney, Agent, or Firm* — Fitch, Even, Tabin & Flannery LLP

(57) ABSTRACT

System and methods for a clock system disciplined to an external reference. In one embodiment, the clock includes a flywheel oscillator controlled by the external reference and a free running holdover oscillator. The holdover oscillator provides increased accuracy during periods of holdover when the external reference is not available. In a further embodiment, the flywheel oscillator is additionally controlled by a phase-locked loop with the holdover oscillator frequency as input, and a control switch for switching the flywheel oscillator to analog control if the phase-locked loop exhibits a fault.

37 Claims, 8 Drawing Sheets

Related U.S. Application Data

(60) Provisional application No. 61/941,991, filed on Feb. 19, 2014.

(56) References Cited

U.S. PATENT DOCUMENTS

| | | |
|---|---|---|
| 8,576,014 B2 | 11/2013 | Smiley |
| 8,922,421 B2 | 12/2014 | Pomietlasz |
| 8,923,468 B2 | 12/2014 | Chen |
| 2002/0027966 A1* | 3/2002 | Fukuhara ............... H03L 7/081 375/376 |

OTHER PUBLICATIONS

Barrett; "Fractional/Integer-N PLL Basics"; Texas Instruments, Technical Brief SWRA029; Aug. 1999; 55 pages.
Dickerson et al; U.S. Appl. No. 14/626,767, filed Feb. 19, 2015.
Hewlett Packard; "HP SmartClock Technology"; 1998; 32 pages.
Miller et al; "A Multiple Modulator Fractional Divider"; IEEE Transactions on Instrumentation and Measurement; vol. 40, No. 3; Jun. 1991; pp. 578-583.
Silver; "Hands-On Radio Experiment #68—Phase Locked Loops, the Basics"; Sep. 2008; 2 pages.
USPTO; Notice of Allowance issued in U.S. Appl. No. 14/626,767, dated Feb. 9, 2016.

* cited by examiner

| Holdover Interval | Estimated Uncertainty |
|---|---|
| 15 min. | 21 ns |
| 30 min. | 31 ns |
| 60 min. | 42 ns |
| 2 hours | 93 ns |
| 4 hours | 0.22 μs |
| 8 hours | 0.53 μs |
| 12 hours | 0.82 μs |
| 24 hours | 1.78 μs |
| 2 days | 4.0 μs |
| 4 days | 7.9 μs |
| 7 days | 18.4 μs |
| 14 days | 43 μs |
| 30 days | 107 μs |

FIG. 8

HIGH-RELIABILITY HOLDOVER METHOD AND TOPOLOGIES

This application is a continuation of U.S. application Ser. No. 14/626,767, filed Feb. 19, 2015, for HIGH-RELIABILITY HOLDOVER METHOD AND TOPOLOGIES, which claims the benefit of U.S. Provisional Application No. 61/941,991, filed Feb. 19, 2014, for HIGH-RELIABILITY HOLDOVER METHOD AND TOPOLOGIES, which is incorporated in its entirety herein by reference.

BACKGROUND OF THE INVENTION

1. Field of the Invention

The present invention relates generally to timing systems and more particularly to timing and synchronization systems including an external reference and an internal oscillator.

2. Discussion of the Related Art

A clock is a device for telling time. It consists of three parts: means to set the time; means to advance the time in a controlled fashion; and means to display the time or generate useful outputs, such as time codes, which allow a user to observe or record the time.

Clocks may be mechanical or electronic. The means described here may be implemented in numerous ways; the time may be advanced, for example, using a pendulum, a mechanical escapement mechanism, or a quartz crystal oscillator and electronic frequency divider or counter.

A disciplined clock is a clock in which the means to advance the time, and most commonly also the means to set the time, are provided by one or more inputs for external time reference signals. These inputs might be derived from terrestrial radio time signals, from satellite signals (e.g. GPS or other navigation satellite systems), from a computer network (e.g. Network Time Protocol or NTP), from a locally-available time code (e.g. 1PPS or IRIG-B), or other similar methods, without limitation.

Disciplined clocks commonly contain an oscillator to assist in advancing the time. The more accurate this oscillator (i.e., the closer its rate to the actual rate of time), the more useful it is in maintaining time if the external reference is lost or degraded. An oscillator designed to provide specified accuracy in the event of loss of the external reference time signal is commonly called a holdover oscillator (HO). The HO also provides a backup in the event that the external reference time signal is 'spoofed' by a potential adversary.

Lower-quality oscillators may be used, providing the function of a 'flywheel,' allowing the clock to interpolate time intervals shorter than that provided by the external reference, and to ride through momentary disruptions. The flywheel oscillator can also provide some holdover capability, though normally with limited performance.

The primary difference between a holdover oscillator and a flywheel oscillator is the time interval over which they are intended to be useful. A flywheel oscillator provides a stable frequency for a short time, perhaps a few seconds or minutes; while a holdover oscillator is intended to provide a usable, stable frequency for periods ranging from hours to days or even months.

A simple quartz crystal oscillator has an accuracy of approximately 10 parts per million (ppm), which means that it might gain or lose 10 microseconds per second, approximately one second per day. This can be adequate for lower-accuracy requirements, for instance a simple wall clock. Technical applications for accurate time often have far more stringent requirements; for these applications, higher-performance holdover oscillators are often required.

Examples of higher performance oscillators include temperature-compensated crystal oscillators (TCXO), oven-controlled crystal oscillators (OCXO), and atomic standards (rubidium or cesium oscillators, or hydrogen masers).

Holdover oscillators (and flywheel oscillators) are typically controlled ('disciplined') by the external reference, when it is available. This is implemented by means of a tune input to the HO. By adjusting the HO frequency to match the rate of the external reference, the error in holdover can be minimized.

An unintended and undesirable consequence of this is that any errors arising when generating this tuning signal degrade the stability (accuracy) of the holdover oscillator, when the external reference is unusable. The better the potential performance of the HO, the more critical (and costly) minimizing these errors becomes. Furthermore, HO analog-tuning linearity (a factor in accuracy, and more importantly in estimating the HO error) is rarely very good; linearity of +/−10% is typical.

A further, even more serious consequence of the design is that the holdover oscillator becomes a critical failure point of the design. If the HO fails outright, the clock stops. More common is a partial failure, where the HO continues to operate but with errors (time drift) far greater than specified. This might be the consequence, for example, of failure of the oven heater in an OCXO.

Prior art, such as taught by U.S. Pat. No. 8,576,014 to Smiley et al. (hereinafter "Smiley") discusses selection of different external reference signals based on their performance. Smiley anticipates the availability of a plurality of external references, which may come and go from time to time, and whose accuracy may also vary with time. Smiley teaches a method of selecting between them based on the performance and availability of these references at any point in time.

SUMMARY OF THE INVENTION

Several embodiments of the invention advantageously address the needs above as well as other needs by providing a disciplined clock system comprising: a flywheel oscillator receiving a tuning voltage and outputting a flywheel oscillator frequency to a first counter responsively outputting a first counter time signal, wherein the flywheel oscillator frequency is controlled by the tuning voltage; a holdover oscillator outputting a holdover oscillator frequency to a second counter responsively outputting a second counter time signal; a time comparator module communicatively coupled to an external reference, the first counter, and the second counter, the time comparator module configured to perform the steps of: receive the first counter time signal, the second counter time signal, and an external reference time signal from the external reference; compare the external reference time signal, the first counter time signal and the second counter time signal, wherein a difference between two signals is a time error value; and responsively output a time error output including at least one time error value; a clock control module coupled to the time comparator module and receiving the time error output and performance data from at least one of the holdover oscillator and at least one sensor, and responsively outputting the voltage control; and a digital-to-analog converter coupled to the clock control module and the flywheel oscillator, the digital-to-analog converter receiving the voltage control and responsively outputting the tuning voltage to the flywheel oscillator; wherein the time error output is used by the clock control module to determine the voltage control when the external reference time signal is reliable; and wherein the time error output and the performance data are used by the clock control module to determine the voltage control when the external reference time signal is unreliable.

In another embodiment, the invention can be characterized as a method for operating a disciplined clock system, comprising the steps of: determining whether an external reference time signal is available; determining, when the external reference time signal is available, whether the external reference time signal is reliable; outputting a first counter time signal from a first counter coupled to a flywheel oscillator; outputting a second counter time signal from a second counter coupled to a holdover oscillator; outputting a time error signal comprising the steps of: comparing the external reference time signal, the first counter time signal and the second counter time signal, wherein a difference between two signals is a time error value; responsively outputting a time error output including at least one time error values; updating voltage control of the flywheel oscillator by a clock control module, the voltage control based at least on the time error output; recording at least one of current holdover oscillator data and sensor data from at least one sensor; and outputting the first time signal from the first counter.

In another embodiment, the invention can be characterized as a disciplined clock system comprising: a phase-locked loop system comprising: a flywheel oscillator controlled by the phased-locked loop system, wherein a flywheel oscillator frequency is output to a first counter; a holdover oscillator outputting a holdover oscillator frequency, the holdover oscillator frequency used by the phase-locked loop system to control the flywheel oscillator; performance data comprising at least one of holdover oscillator data from the holdover oscillator and sensor data from at least one sensor; at least one phase-locked loop parameter used to control the flywheel oscillator; a first counter receiving the flywheel oscillator frequency and responsively outputting a first counter time signal; a time comparator module communicatively coupled to an external reference and the first counter, the time comparator module configured to perform the steps of: receiving the first counter time signal and an external reference time signal from the external reference; comparing the external reference time signal and the first counter time signal, wherein a difference between two signals is a time error value; and responsively outputting a time error output including at least one time error value; and a clock control module coupled to the time comparator module and configured to receive the performance data, the time error output and responsively output at least one phase-locked loop parameter to the phase-locked loop system; wherein the time error is used by the clock control module to determine the phase-locked loop parameters when the external reference time signal is reliable; and wherein the performance data are used by the clock control module to determine the at least one phase-locked loop parameter when the external reference time signal is unreliable.

In yet another embodiment, the invention may be characterized as a method for operating a disciplined clock system, comprising the steps of: determining whether an external reference time signal is available; determining, when the external reference time signal is available, whether the external reference time signal is reliable; outputting a first counter time signal from a first counter coupled to a flywheel oscillator; outputting a time error output when the external reference time signal is reliable comprising the steps of: comparing the external reference time signal and the first counter time signal, wherein a difference between two signals is a time error value; and responsively outputting a time error output including at least one time error value; receiving of the time error output by a clock control module; outputting by the clock control module of at least one phase-locked loop parameter to a phase-locked loop including the flywheel oscillator and the holdover oscillator, whereby the flywheel oscillator is controlled at least by the at least one phase-locked loop parameter and the holdover oscillator; recording at least one of current holdover oscillator data and sensor data from at least one sensor; and outputting the first time signal from the first counter.

BRIEF DESCRIPTION OF THE DRAWINGS

The above and other aspects, features and advantages of several embodiments of the present invention will be more apparent from the following more particular description thereof, presented in conjunction with the following drawings.

FIG. 8 is a holdover uncertainty table in one embodiment of the present invention.

Figure 1:
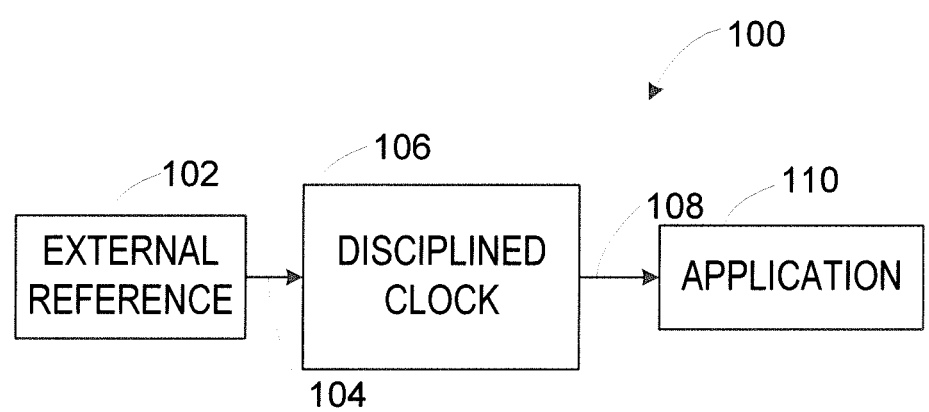
FIG. 1 is a schematic diagram of a disciplined clock system in one embodiment of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

The following description is not to be taken in a limiting sense, but is made merely for the purpose of describing the general principles of exemplary embodiments. The scope of the invention should be determined with reference to the claims.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention can be practiced without one or more of the specific details, or with other methods, components, materials, and so forth. In other instances, well-known structures, materials, or operations are not shown or described in detail to avoid obscuring aspects of the invention.

Referring first to FIG. 1, an exemplary disciplined clock system 100 is shown. Shown are an external reference 102, an external reference time signal 104, a disciplined clock 106, a time signal 108, and an application 110.

The external reference 102 is a time signal source sending a periodic time signal, the external reference time signal 104, which in some embodiments is traceable to international standards. Sources of external reference time signals 104 include satellite signals such as GPS, GLONASS etc.; terrestrial radio signals such as WWVB, DCF, and LORAN; network timing signals such as NTP and PTP; and local time signal inputs such as IRIG-B or 1PPS. Multiple external reference signals may also be 'ensembled' (combined, selected from, and/or averaged through suitable means), which can allow some improvement in accuracy by averaging, depending on the quality of the external references 102. The term 'external reference time signal' as used herein includes ensembled external reference signals.

The disciplined clock 106 receives the external reference time signal 104 from the external reference 102. The interface between the external reference 102 and the disciplined clock 106 may take any appropriate form, for example, a GPS receiver to receive the external reference time signal 104 (e.g., 1 PPS) from a GPS satellite and a time of day data available at a communications port such as serial (EIA-232) or USB. There exists an association between the 1PPS and data signals such that the time of day may be accurately associated with a specific 1PPS pulse. A GPS receiver typically has a one pulse per second (1PPS) output, which is accurate to better than 100 nanoseconds.

The disciplined clock 106 receives the external reference time signal 104, as available, and outputs the time signal 108. The time signal 108 is received by an application 110, for example a display displaying the current time. If the external reference 102 is unavailable, the time signal 108 is determined using an internal oscillator.

Figure 2:
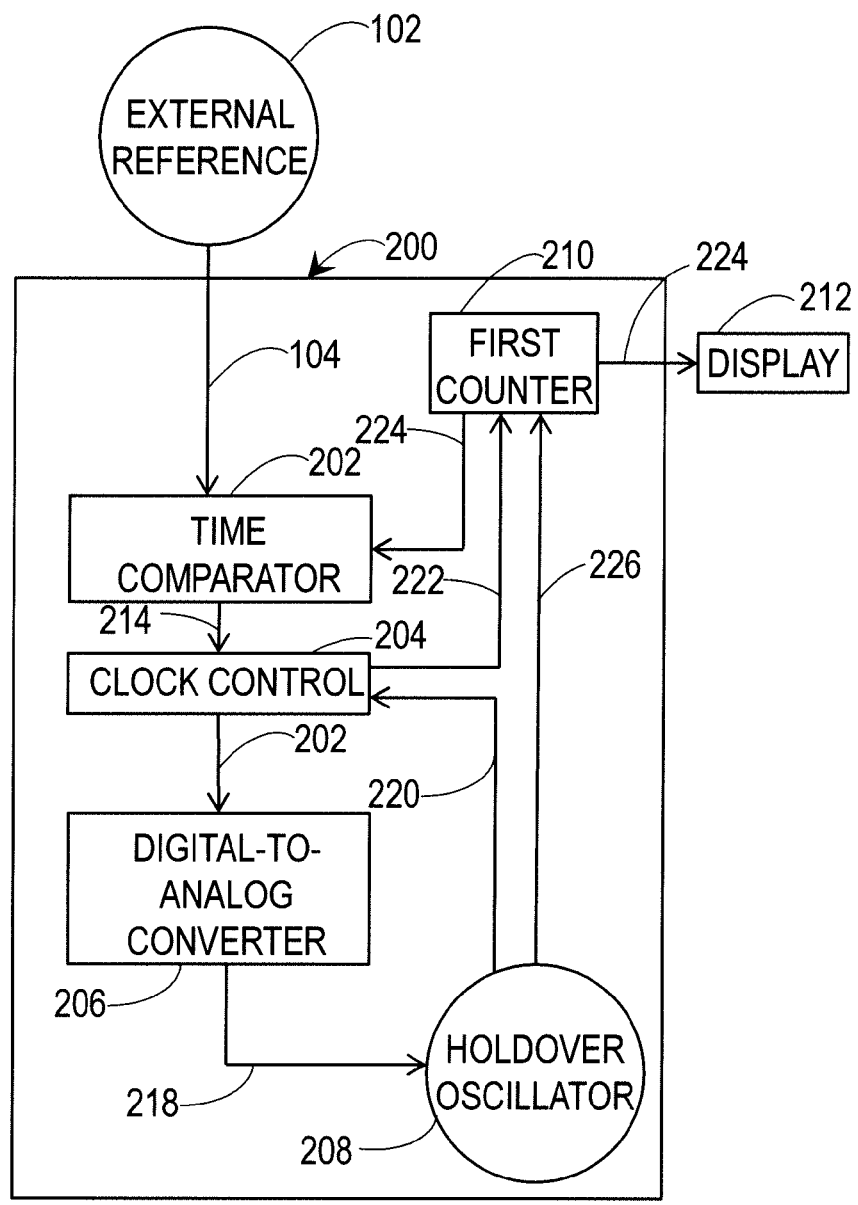
FIG. 2 is a schematic diagram of a disciplined clock in one embodiment of the prior art.

Referring next to FIG. 2, an exemplary disciplined clock 200 is shown in accordance with the prior art. Shown are the external reference 102, the external reference time signal 104, a time comparator 202, a clock control module 204, a digital-to-analog converter (DAC) 206, a holdover oscillator 208, a first counter 210, a display 212, a time error output 214, a voltage control 216, an analog tuning voltage 218, holdover oscillator data 220, a counter adjustment 222, a first counter time signal 224, and a holdover oscillator frequency 226.

As is known in the art, the time comparator 202 is a module that is at least communicatively coupled to the external reference 102 and the first counter 210, and compares time signals from at least two sources. For example, the time comparator 202 of FIG. 2 receives the external reference time signal 104 from the external reference 102 and the first counter time signal 224 from the first counter 210. The time comparator 202 is coupled to the clock control module 204 and outputs the time error output 214, the difference between the first counter time signal 224 and the external reference time signal 104, to the clock control module 204.

The clock control module 204, as known in the art, includes elements configured to monitor and control the elements of the disciplined clock 106. In one embodiment the clock control module 204 may be implemented on a microprocessor with at least one non-transitory memory coupled to the microprocessor. The clock control module 204 may include a "means to set time" function which monitors the external reference time signal 104 and adjusts the first counter time signal 224 to match the external reference time signal 104 if the first counter time signal 224 exceeds a certain error limit set by design or, alternatively, configured by a user. The "means to set time" function also checks for noise or glitches, or other momentary errors in the external reference time signal 104, using an error bypass, and sets the first counter time signal 224 only if a sustained error in the external reference time signal 104 satisfies an error bypass threshold, which is established to bypass the momentary errors. If the error bypass threshold is not satisfied, the "means to set time" function prevents the first counter time signal 224 from being set to the external reference time signal 104 and monitors the external reference time signal 104 until the external reference time signal error satisfies the error bypass threshold. The error bypass is typically a small number (e.g. 3 to 5) of time error measurements in a contiguous sequence; an error bypass counter is incremented whenever the time error exceeds the certain error limit, and is reset to zero at any time the error is below the certain error limit.

The "means to set time" function, and all other functions and modules required by the disciplined clock systems and methods, are implemented using appropriate elements, dependent of the implementation of the first counter 210. for instance, the "means to set time" function in communication with a counter implemented as part of a microcontroller may use a suitable firmware algorithm in the microcontroller. A counter implemented in hardware may be set by means of dedicated control signals from the microcontroller or directly from the interface to the external reference time signal 104.

The clock control module 204 is also coupled to and receives data 220 from the holdover oscillator (HO) 208, or from independent sensors, or both, regarding the ongoing status of various time dependent parameters such as frequency, temperature, age, and barometric pressure, as required for clock control functions and other clock operations. The data 220 may be saved and used to determine trends of the HO performance and parameters over time.

Recording actual data 220 of the measured HO performance (time error, or frequency offset, vs. time) allows estimation of the expected future uncertainty of the HO frequency 226 predictions, and the resulting time quality, with improved confidence.

This estimate is therefore not generic, but rather individual for each clock 106, based on the actual, historic performance of the individual HO 208 in that clock 106, in its actual operating environment. These estimates provide both a measure of time quality, and an indication of HO performance, both during the manufacturing process and in operation. Performance that is worse than expected, or is degrading over time, is a possible indication of a faulty HO. Some implementations in the prior art use instead estimated HO performance, which can lead to significant errors in estimating HO performance—both overly pessimistic, when the oscillator is working well, or overly optimistic if the HO performance has (unknown to the clock control module 204) degraded.

For example, to estimate a current 24-hour holdover uncertainty, historical oscillator data 220 for a starting period is used to predict the holdover time 24 hours after the end of that period, and compare predicted to actual. A sequence of such calculations, for successive 24-hour intervals up to the present, is performed. The resulting errors of predicted vs. actual, compiled over this sequence, are analyzed using statistical methods. These results are used to estimate the error bounds (tolerance interval at a given confidence level) of the projected performance in holdover, if the external reference 102 were presently to become unusable, over the next 24 hours.

The clock control module 204 uses the inputs of the time error output 214 and HO data 220 and performance trends to regulate the HO 208. The clock control module 204 provides logic and algorithms that determine how the clock system 200 operates and maintain an optimum estimate of time under changing conditions. Functions typically provided include: (a) Initial power-on tracking, where the clock system 200 acquires the external reference 102, sets the time, and begins to adjust the frequency 226 of the holdover oscillator 208; (b) Continuous tracking, where the clock system 200 continually adjusts the frequency 226 of the holdover oscillator 208 to minimize the error at the output of the time comparator 202 (this is a form of phase-locked loop (PLL)); (c) Monitoring the performance of the holdover oscillator 208; (d) Monitoring the performance and availability of the external reference 102; and (e) controlling the frequency 226 of the holdover oscillator 208 when the external reference 102 is not available, so as to minimize the projected time error in holdover. These functions are normally provided using a microcontroller, running a specialized firmware program designed specifically for the purpose. In some embodiments, the HO 208 is controlled using a proportional-integral or a proportional-integral-derivative control function. Other means to design servo control loops are well-known and documented in the prior art, and are also applicable to control the HO frequency 226.

Based on the control functions of the clock control module 204, the voltage control 216 is output to the DAC 206 coupled to the clock control module 204. The DAC 206 converts the digital voltage control value signal received from the voltage control 216 and converts it to the analog tuning voltage 218. The analog tuning voltage 218 is output to the holdover oscillator 208, which is electrically coupled to both the DAC 206 and the first counter 210. The frequency output 226 of the HO 208 varies dependent on the tuning voltage, therefore the HO frequency output 226 is adjusted as required to keep the HO frequency 226 in tune with the external reference time signal 104. A consequence of this is that any errors arising when generating the analog tuning voltage 218 degrade the stability (accuracy) of the holdover oscillator 208 when the external reference 102 is unusable. The better the potential performance of the HO 208, the more critical (and costly) minimizing these errors becomes. Furthermore, HO analog-tuning linearity (a factor in accuracy, and more importantly in estimating the HO error) is rarely very good; linearity of +/−10% is typical.

The type of HO 208 is such that the performance of the HO 208 is adequate, in the absence of the external reference time signal 104, to maintain time with a required accuracy. The holdover oscillator 208 may be one of: an oven-controlled crystal oscillator, an atomic frequency standard, a temperature-compensated crystal oscillator, a voltage-controlled crystal oscillator, or any other device whose frequency may be controlled externally and which provides adequate performance. Technical requirements may require high-performance holdover oscillators 208 such as temperature-compensated crystal oscillators (TCXO) providing performance around 1 ppm frequency error; oven-controlled crystal oscillators (OCXO) providing performance around $10^{-9}$ (0.001 ppm or 1 part per billion, ppb), and atomic standards (rubidium or cesium oscillators, or hydrogen masers) can provide performance in the range of $10^{-11}$ to $10^{-14}$.

As the required accuracy of the HO 208 increases, the higher the cost and complexity of the holdover oscillator 208, and the lower its reliability. Complex, expensive holdover oscillators 208, containing more components, have correspondingly higher failure rates. If the HO 208 is comprised of 30 components (typical for an OCXO), it will have an overall per-unit failure rate of approximately 2000 (64×30). This is 1000 times greater than a simple hybrid clock oscillator, suitable as a flywheel oscillator, comprising only two components: a quartz crystal and a sustaining amplifier integrated circuit (IC), operating at room temperature. Atomic standards typically include many more than 30 components, and in addition to component reliability issues, often have an inherent limited lifetime due to depletion of the reservoir of atomic material (rubidium or cesium) in their physics package.

Additionally, most high-performance holdover oscillators 208 operate much of their electronics at a controlled temperature, most often significantly above ambient; e.g. around 85° C. Failure rate of electronic components is temperature-sensitive and typically doubles for each 10 degrees C. increase. So, the HO 208 operating at 85° C. would have a per-component failure rate around 64 times ($=2^6$) greater than it would be at 25° C. (60 degrees C. higher temperature).

The holdover oscillator 208 outputs the tuned frequency 226 to the first counter 210, which receives the frequency 226 and increments following the frequency signal 226 from the holdover oscillator 208, advancing the time. The first counter 210 in one embodiment is a digital circuit, which may be implemented in dedicated hardware such as a logic circuit (either discrete or integrated, as in an ASIC or FPGA), or a microcontroller or other programmable device, a combination of the two, or any equivalent method. The output of this counter is an approximation of the present time. For example, if the holdover oscillator 208 is 10 MHz (10 million cycles per second), the first counter 210 may comprise a divide-by-10,000 counter implemented in a logic circuit, and a microcontroller. The divide-by-10,000 counter has a 4-digit output with a resolution of 100 nanoseconds (1/10 MHz), and generates a 1 kHz clock to the microcontroller, which uses a firmware routine to count the more significant digits of time with a resolution of 1 millisecond (1/1 kHz). The time comprises the concatenation of the data from the hardware counter and the counter implemented in microcontroller firmware. Many other equivalent implementations are possible, and known or evident to those skilled in the art.

The first counter 210 then outputs the first counter time signal 224 to the time comparator 202 to be used in the next cycle. The time signal is output from the clock 106 as required, in this embodiment to the display 212. The display 212 then displays the current time. The first counter time signal 224 may be output to conventional clock faces and digital displays of time, or also for technical applications of time, include output signals which allow time to be transferred from the clock system 200 to client devices. Such interfaces include (a) analog time codes, such as IRIG-B; (b) time protocols, such as IRIG-J, NTP, SNTP, and PTP, which are transmitted over communications interfaces such as serial (EIA-232 or RS-485) interfaces, Ethernet, local area networks, and wide area networks; and (c) pulses, such as 1PPS and other pulses having a specified width, period and signal levels. These signals may be transmitted using electrical interfaces or fiber-optic interfaces, as required by the application 110.

Figure 3:
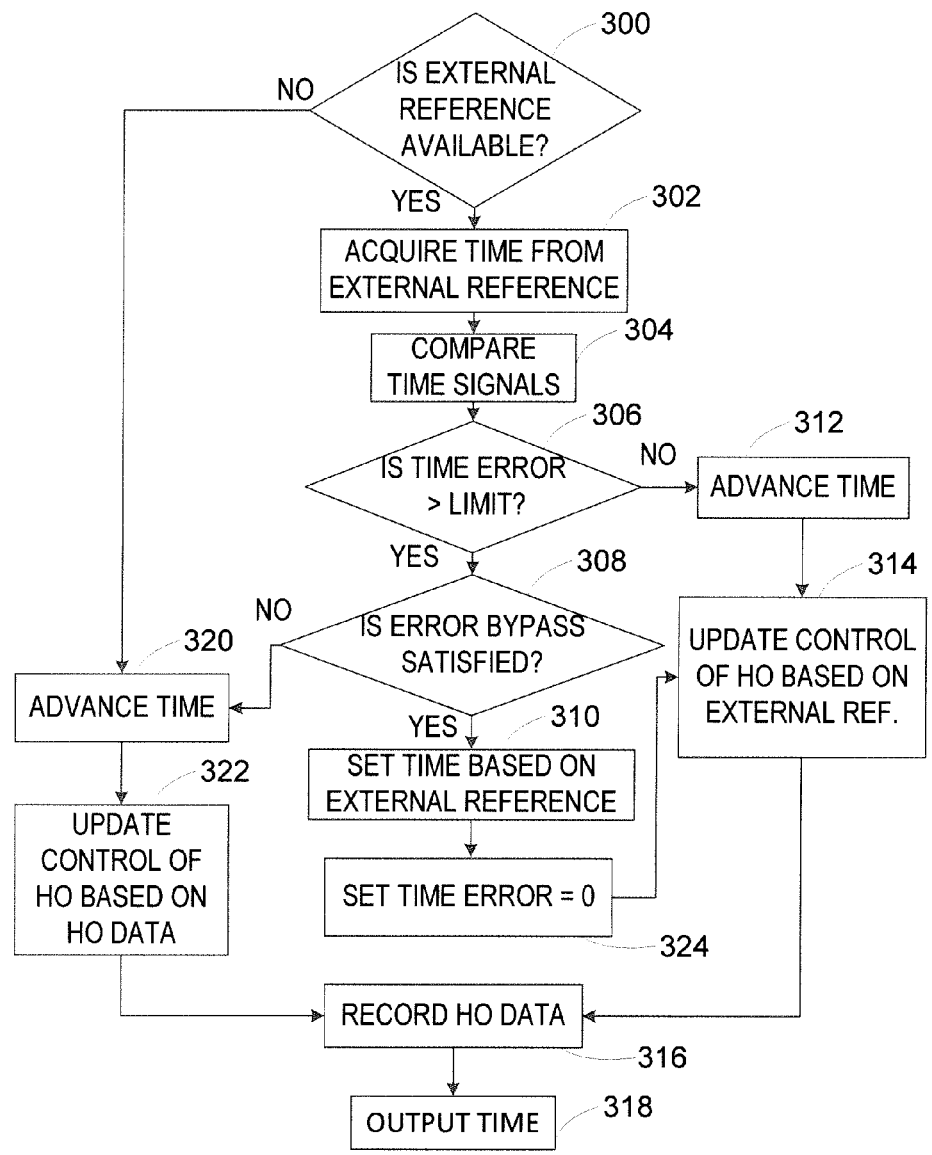
FIG. 3 is a process diagram of the disciplined clock of FIG. 2

Referring next to FIG. 3, an exemplary embodiment of the operational process of the prior art disciplined clock 200 of FIG. 2 is shown. Shown are an external reference available decision point 300, an acquire external reference time step 302, a compare time step 304, a time error decision step 306, an error bypass decision step 308, an external reference set time step 310, a first advance time step 312, an external reference HO control step 314, a record HO data step 316, an output time step 318, a second advance time step 320, a holdover HO control step 322, and a reset time error step 324.

Those or ordinary skill in the art will note that, while the operational processes are necessarily described herein in a sequential fashion, the order of many of the process steps is interchangeable. The process steps shown herein are not limited to the sequences shown, but may operate in any order and/or simultaneously, as long as the overall process is carried out by the systems and processes as described herein and noted in the prior art.

Initially, in the external reference available decision point 300, the system determines if the external reference time signal 104 is available. If the external time reference signal is available, the process proceeds to the acquire external reference time step 302. If the external reference time signal 104 is unavailable, the process proceeds to the second advance time step 320.

In the acquire external reference time step 302, the time comparator 202 obtains the external reference time signal 104 from the external reference 102. In the following step, the compare time step 304, the time comparator 202 compares the external reference time signal 104 and the first counter time signal 224 (based on the holdover oscillator frequency 226) and determines a HO time error value comprising the difference between the first counter time signal 224 and the external reference time signal 104. In the clock system 200 of FIG. 2, the HO time error value comprises the time error output 214. The time comparator 202 is coupled to the clock control module 204 and outputs the time error output 214 to the clock control module 204. The process then proceeds to the time error decision step 306.

If the HO time error value exceeds a certain limit, either set by the user or determined by the clock control module 204, the process proceeds to the error bypass decision step 308. If the HO time error value does not exceed the limit, the process proceeds to the first advance time step 312.

During the advance time step, the first counter 210 advances the time based on the holdover oscillator frequency 226 received from the holdover oscillator 208. The process then proceeds to the external reference HO control step 314.

In the external HO control step, the clock control module 204 uses the time error output 214 determined in the time error decision step 306 to optimally change the voltage control 216 via input to the DAC 206, which then adjusts the HO frequency 226 as required to match the external reference time signal 104. The process then proceeds to the record HO data step 316.

During the record HO data step 316, the clock control module 204 receives the HO status data 220 previously mentioned in FIG. 2. The process then proceeds to the output time step 318, where the first counter 210 outputs the time signal that was advanced in the advance time step.

In the case where the time error output 214 exceeds the limit, the process proceeds instead to the error bypass decision step 308. During the error bypass decision step 308, the clock control module 204 determines if the error bypass threshold, as previously described in FIG. 2, is exceeded. If the error bypass threshold is not satisfied, the external reference 102 may be experiencing momentary errors and should not be used to set the time. The process would then proceed to the second advance time step 320. If the error bypass is satisfied, the external reference 102 is presumed to indicate a persistent time error in the first counter 210, and, the process proceeds to the external reference set time step 310.

During the external reference set time step 310, the external reference 102 is used to adjust the first counter 210 to match the external reference time signal 104 (the counter adjustment 222 as shown in FIG. 2). The process then proceeds to the reset time error step 324, where the HO time error value is reset to 0, since the first counter time signal 224 has been reset to match the external reference time signal 104. The process then proceeds to the external reference HO control step 314, and continues through the rest of the process.

If the error bypass threshold is not satisfied, or if during the initial external reference available decision point 300 the external reference time signal 104 is found to be unavailable, the process continues to the second advance time step 320. During the second advance time step 320, the first counter time signal 224 is advanced using the frequency 226 received from the HO 208 (the HO frequency 226 as shown in FIG. 2). The process then proceeds to the holdover HO control step 322.

During the holdover HO control step 322, the HO 208 is controlled without using the external reference 102, either because the external reference 102 is unavailable or because the time error output 214 exceeds the prescribed limits. The voltage control 216 is instead set by functions of the clock control module 204 that include the history of the HO data 220 as recorded in the record HO data step 316, and other functions as required to provide the maximum accuracy of the HO frequency output 226 during the design holdover period. The process then proceeds to the record HO data step 316 as previously described.

The prior art disciplined clock system 200 of FIGS. 2 and 3 requires the complex and failure-prone holdover oscillator 208 to supply the required reliability during holdover, but failure of the holdover oscillator 208 results in failure of the clock system 200, as the time output is dependent on the frequency 226 received from the HO 208. If the HO 208 fails outright, the clock stops. More common is a partial failure, where the HO 208 continues to operate but with errors (time drift) far greater than specified. This might be the consequence, for example, of failure of the oven heater in an OCXO. For a GPS disciplined clock 106, the likelihood of HO 208 failure may be much higher than the likelihood of loss of the GPS signal.

Additionally, the prior art system uses the DAC 206 to provide the tuning voltage for the HO 208. Errors in the DAC 206 (linearity, reference voltage stability, gain drift, offset drift, temperature drift, resolution, noise, etc.) and in the voltage input of the HO 208 (linearity, stability, drift, noise, etc.) are thus included when the clock control module 204 uses the HO frequency history to control the HO frequency 226. These errors also limit the ability of the clock control module 204 to accurately predict the future frequency 226 of the HO 208.

Figure 4:
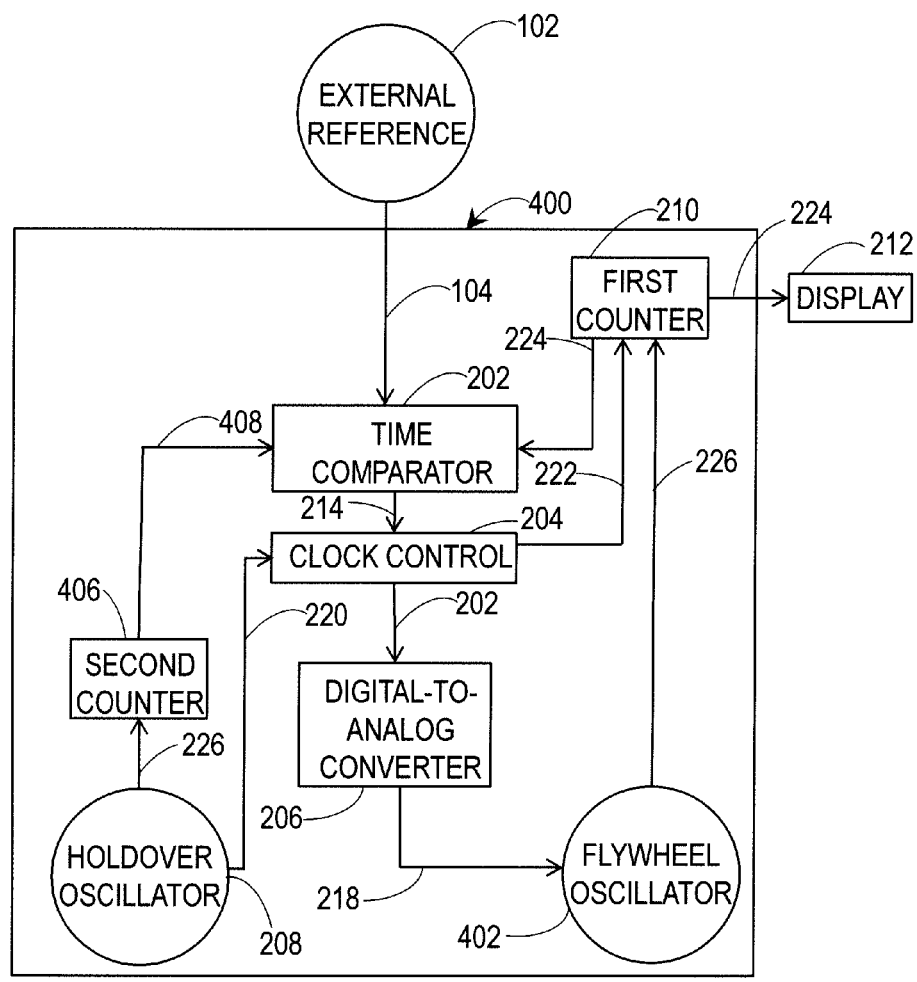
FIG. 4 is a schematic diagram of the holdover disciplined clock in one embodiment of the present invention.

Referring next to FIG. 4, a holdover disciplined clock system 400 is shown in one embodiment of the present invention. Shown are the external reference 102, the external reference time signal 104, the time comparator 202, the clock control module 204, the digital-to-analog converter (DAC) 206, the holdover oscillator 208, the first counter 210, the display 212, the time error output 214, the voltage control 216, the analog tuning voltage 218, the holdover oscillator data 220, the counter adjustment 222, the first counter time signal 224, a flywheel oscillator 402, a flywheel oscillator frequency 404, a second counter 406, and a second counter time signal 408.

In the modified holdover disciplined clock system 400, the holdover oscillator 208 of FIG. 2 has been replaced by the flywheel oscillator (FO) 402. The FO 402 receives the tuning voltage controlled by the clock control module 204 (via the DAC 206) and outputs the FO frequency 404 to the first counter 210. As previously noted, flywheel oscillators are less failure-prone but lack the ability to keep precise time over a holdover period. Examples of devices suitable for use as a flywheel oscillator include simple, low-cost voltage controlled oscillators (VCO), voltage-controlled crystal oscillators (VCXO), voltage-tuned MEMS oscillators, and other simple, reliable tunable oscillators. Higher performance HOs as described earlier also are suitable but without the advantage of low cost and improved reliability.

The holdover disciplined clock 400 of FIG. 4 additionally includes the holdover oscillator coupled to and providing the HO frequency 226 to the second counter 406. The second counter 406 is then coupled to and provides the second counter time signal 408 to the time comparator 202. The time comparator 202 compares the external reference time signal 104, the first counter time signal 224, and the second counter time signal 408 to produce two values comprising the time error output 214. Generally, the most advantageous two (with respect to calculation simplicity) are the difference between the external reference 102 and the first counter time signal 224; and that between the first and second counter time signals 228, 408. However, it can be shown that any two differences derived from these three signals are mathematically equivalent, so the choice is immaterial other than for practical considerations.

The second counter 406 may be similar in function and implementation to the main counter, or may be different, for example, if the oscillators operate at significantly difference frequencies. The second counter 406 may or may not be synchronized to the external reference 102 at some point (i.e. using the "means to set time" function); but in general it is not required to be, and in operation (i.e. once initialized), it is not re-synchronized. The purpose of the HO is to generate the second time signal that can be compared to the first counter time signal 224 (driven here by the flywheel oscillator 402). In one embodiment, the holdover disciplined clock 400 of FIG. 4 divides the free-running HO frequency 226 down to a convenient rate using a fixed counter circuit (an integer divider), for example to 1PPS (pulse per second).

Referring again to FIG. 4, the HO frequency 226 is not controlled by the clock control module 204. This allows improved stability of the holdover oscillator time signals, i.e. less variation with time and environmental conditions, since generating the analog tune voltage cannot be performed perfectly. Errors generating the analog tune voltage, e.g. using the digital-to-analog converter, cause corresponding errors in the output of the holdover oscillator 208. Eliminating these errors therefore improves holdover oscillator stability.

The tradeoff is that the holdover oscillator frequency 226 is no longer accurate—there is an error in its output frequency with respect to the external reference time signal 104. But that error is relatively constant, and it can be monitored by the clock control module 204. This error results in a small, accumulating time difference in the second counter 406; that difference is determined by the clock control module 204 when the external reference 102 is available, and the difference may be used in turn to control the flywheel oscillator 402 when the external reference 102 is not available.

For example, if the fixed error in the holdover oscillator 208 is plus one part per million, the time in the second counter 406 will gain one microsecond every second. Since the clock control module 204 can monitor this rate when the external reference 102 is available, the clock control module 204 knows what the holdover oscillator time error is with respect to the external reference time signal 104. When the external reference 102 becomes unavailable, the clock control module 204 can compensate for the fixed error of the holdover oscillator 208 when adjusting the flywheel oscillator frequency 404. The holdover disciplined clock 400 can thereby benefit from the stability of the HO without transferring any time error of the HO 208 to the FO 402.

Higher-order errors (e.g., aging), and environmental sensitivities, can also be corrected in the clock control module 204 by means of suitable microcontroller firmware programming routines as previously mentioned and if desired, environmental sensors such as temperature sensors suitably interfaced to the clock control module 204.

Furthermore, failure of the HO 208 no longer results in the failure of the holdover disciplined clock 400, as it does for the prior art clock of FIGS. 2 and 3. The time output is now dependent on the less failure-prone flywheel oscillator 402, and failure of the HO 208 may decrease the accuracy of the holdover disciplined clock 400 during holdover but does not result in clock failure.

Figure 5:
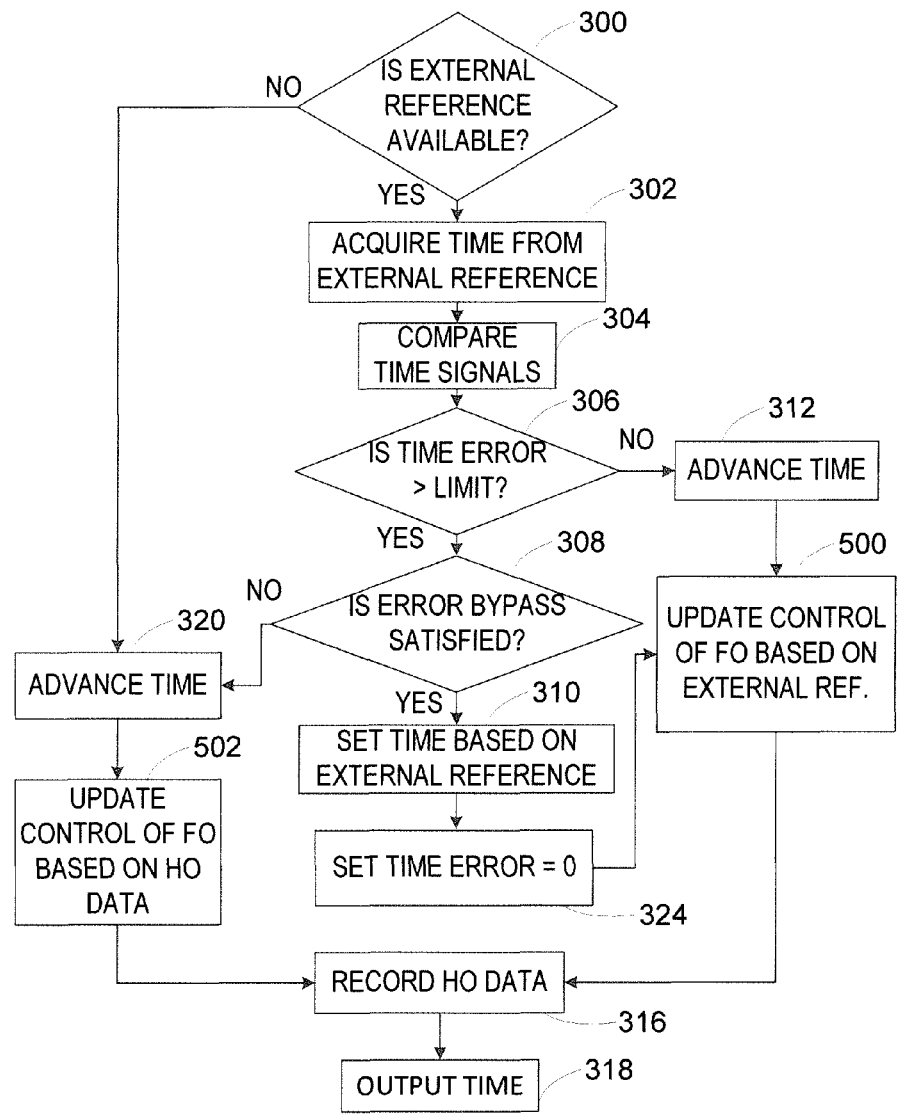
FIG. 5 is a process diagram of the holdover disciplined clock of FIG. 4.

Referring next to FIG. 5, the operational process of the holdover disciplined clock 400 of FIG. 4 is shown. Shown are the external reference available decision point 300, the acquire external reference time step 302, the compare time step 304, a FO time error decision step 306, the error bypass decision step 308, the external reference set time step 310, the reset time error step 324, the first advance time step 312, a record HO data step 316, the output time step 318, a second advance time step 320, an external reference FO control step 500, and a holdover FO control step 502.

The process is generally similar to the process shown in FIG. 3, with the exception of the control updating steps, and the time signal and time error determination steps.

Initially, in the external reference available decision point 300, the system determines if the external reference time signal 104 is available. If the external time reference signal is available, the process proceeds to the acquire external reference time step 302. If the external reference time signal 104 is unavailable, the process proceeds to the second advance time step 320.

In the acquire external reference time step 302, the time comparator 202 obtains the external reference time signal 104 from the external reference 102. In the following step, the time error decision step 306, the time comparator 202 compares the external reference time signal 104, the first counter time signal 224 (based on the FO frequency 404), and the second counter time signal 408 (based on the HO frequency 226) and determines two time error values comprising the time error output 214 (as previously described in FIG. 4). If a time error between the FO 402 and the external reference 102 exceeds a certain limit, either set by the user or determined by the clock control module 204 the process proceeds to the error bypass decision step 308. If the FO-external reference time error does not exceed the limit, the process proceeds to the first advance time step 312.

During the advance time step, the first counter 210 advances the time based on the holdover oscillator frequency 226 received from the holdover oscillator 208. The process then proceeds to the external reference FO control step 500.

In the external reference FO control step 500, the clock control module 204 uses the time error values determined in the compare time signals step to optimally change the voltage control 216 via input to the DAC 206, which then adjusts the FO frequency 404 as required to match the external reference time signal 104. The process then proceeds to the record HO data step 316.

During the record HO data step 316, the clock control module 204 receives the HO data 220 previously mentioned in FIG. 2. The process then proceeds to the output time step 318, where the first counter 210 outputs the time signal that was advanced in the advance time step.

In the case where the time error exceeds the limit, the process proceeds instead to the error bypass decision step 308. During the error bypass decision step 308, the clock control module 204 determines if the error bypass threshold, as previously described in FIG. 2, is satisfied. If the error bypass threshold is not satisfied, the external reference 102 may be experiencing momentary errors and should not be used to set the time. The process would then proceed to the second advance time step 320. If the error bypass satisfies the threshold, the process proceeds to the external reference set time step 310.

During the external reference set time step 310, the external reference 102 is used to adjust the first counter 210 to match the external reference time signal 104 (the counter adjustment 222 as shown in FIG. 4). The process then proceeds to the reset time error step 324, where the time error value is reset to 0, since the first counter time signal 224 has been reset to match the external reference time signal 104. The process then proceeds to the external reference FO control step 500, and continues through the rest of the process as before.

If the error bypass threshold is not satisfied, or if during the initial external reference available decision point 300 the external reference time signal 104 is found to be unavailable, the process continues to the second advance time step 320. During the second advance time step 320, the first counter time signal 224 is advanced using the FO frequency 404. The process then proceeds to the holdover FO control step 502.

During the holdover FO control step 502, the FO 402 is controlled without using the external reference 102, either because the external reference 102 is unavailable or because the time error exceeds the prescribed limits. The voltage control 216 is instead set by functions of the clock control module 204 that use the history of the HO data 220 as recorded in the record HO data step 316, the difference between the first and second counter time signals 224, 408, and other functions (for instance, environmental sensor measurements) as required to estimate the FO analog tune voltage 218 during the design holdover period. The process then proceeds to the output time step 318 as previously described.

The holdover disciplined clock 400 as described in FIGS. 4 and 5 substitutes the less failure-prone FO 402 for the HO 208 of the prior art clock shown in FIGS. 2 and 3. While this reduces the chance of clock failure due to failure of the primary oscillator (the HO 208 in FIG. 2 and the FO 402 in FIG. 4), the FO 402 is less accurate than the HO 208 when the external reference 102 is not available than the HO 208 of the prior art clock. To increase the accuracy of the FO 402, the untuned HO 208 and the second counter 406 are added to provide data and the second counter time signal 408 used to control the FO 402 when the external reference time signal 104 is unavailable. This topology allows the HO 208 to free-run, i.e. its frequency 226 is not controlled. Instead, the HO time error, the generally stable time difference between the first counter time signal 224 and the second counter time signal 408, is determined in the clock control module 204 while the clock 400 is disciplined to the external reference 102, and this offset is used to adjust the flywheel oscillator frequency 404 relative to the holdover oscillator 208. This signal can then be compared to both the time signal driven by the flywheel oscillator 402, and the external reference time signal 104. The HO time error (system clock error in the absence of the external reference 102) may be estimated from the equation $\Delta T = \Delta F \cdot T_H$ where $\Delta T$ is the time error in holdover, $\Delta F$ is the holdover oscillator frequency error, and $T_H$ is the holdover time. The application 110 generally specifies a maximum $\Delta T$ to be maintained for a period $T_H$, thus establishing a corresponding maximum limit for $\Delta F$. The smaller that $\Delta F$ is required to be, the higher the performance and cost of the holdover oscillator 208, and the lower its reliability—complex, expensive devices, containing more components, have correspondingly higher failure rates.

If the HO 208 of the holdover disciplined clock 400 of FIG. 4 fails, the normal operation (i.e. when the external reference time signal 104 is available and used to control the FO frequency 404) is unaffected. As the HO 208 does not require the additional components to allow external tuning (thereby reducing component count), this configuration may also increase the longevity of the HO 208. During normal operation the clock control module 204 monitors the HO data 220 and saves the data history for use for when the holdover disciplined clock 400 is controlled by the HO 208. For example, the clock control module 204 tracks the HO time error between the HO 208 and the external reference 102, and accounts for it when controlling the FO 402 based on the HO frequency 226. Operating the holdover oscillator 208 this way maximizes holdover stability—the vulnerable and error-prone analog tune circuit is eliminated, so its errors do not contribute to reduced holdover stability.

The prior art clock 200 of the type as shown in FIG. 2 has a tune control circuit adapted to the requirements of each type of holdover oscillator 208 that might be installed. These requirements are rarely the same for different holdover oscillators 208, thus complicating the task of using a HO type that was not originally anticipated at the time the clock 200 was designed. Further, a HO type without tune input (for instance, the external atomic standard) cannot easily be used in the FIG. 2 topology.

Clocks using uncontrolled, free-running holdover oscillators 208, however (FIGS. 4 and 6) do not have this limitation. They can accept any type of HO 208, including ones whose frequency cannot be controlled; indeed, this can provide superior performance. Other system limitations, such as power requirements and temperature limits, must still be considered; but the flexibility offered by the present invention simplifies a manufacturer's job in responding to customer requests for products having varying levels of holdover performance.

Figure 6:
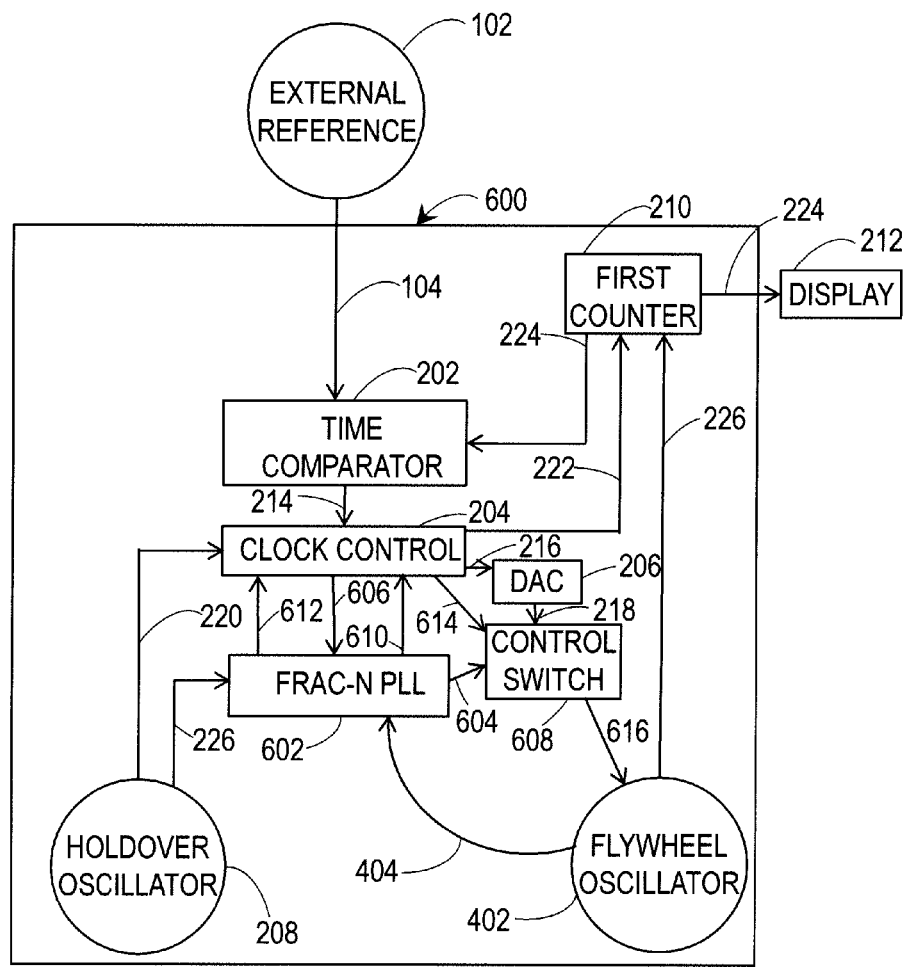
FIG. 6 is a schematic diagram of a holdover fractional-N disciplined clock in a further embodiment of the present invention.

Referring next to FIG. 6, a system diagram of a Fractional-N PLL disciplined clock 600 in another embodiment of the present invention is shown. Shown are the external reference 102, the external reference time signal 104, the time comparator 202, the clock control module 204, the digital-to-analog converter (DAC) 206, the holdover oscillator 208, the first counter 210, the display 212, the time error output 214, the voltage control 216, the analog tuning voltage 218, the holdover oscillator data 220 the first counter time signal 224, the holdover oscillator frequency 226, the flywheel oscillator 402, the flywheel oscillator frequency 404, a Fractional-N Phase-locked Loop (PLL) 602, a PLL set frequency control 604, a clock control PLL adjustment 606, a control switch 608, a PLL fault indication 610, a PLL status 612, a switch control 614, and a selected tune voltage 616.

In the Fractional-N PLL disciplined clock 600 embodiment of FIG. 6, in contrast to FIG. 4, instead of the FO frequency 404 being controlled through the DAC 206 under normal operation, the Fractional-N PLL 602 is added. The Fractional-N PLL 602 is a phase-locked loop as is commonly known in the art, with the holdover oscillator 208 as its reference input signal, the flywheel oscillator 402 as its VCO, and the fractional-N parameter used to control the PLL ratio $F_{out}/F_{ref}$. Fractional-N loops are widely described in the prior art, and the implementation here may follow any of the methods known in the art, selected based on typical engineering criteria for performance, reliability, and cost.

The FO frequency 404 is thereby updated digitally within the Fractional-N PLL 602 (the Fractional-N PLL 602 sets the frequency of the FO 402 via the PLL set frequency control 604, as transferred through the control switch 608 to the FO 402 under normal operation of the PLL, and the FO 402 returns the FO frequency 404 to the loop for use as described previously). The clock control module 204 is also coupled to the Fractional-N PLL 602 and uses the external reference time signal 104 and the HO data 220 to adjust the Fractional-N parameter of the Fractional-N PLL 602 as required, as indicated by the output of the clock control PLL adjustment 606. The use of the Fractional-N PLL 602 to control the FO 402 allows the FO 402 to be controlled digitally, and avoids the errors introduced by digital-to-analog conversion, which were described previously. The clock control module 204 also receives the PLL status 612 of the Fractional-N PLL, including current parameter values, and the holdover oscillator frequency 226 from the HO 208.

The Fractional-N PLL 602, as with any PLL, keeps the phase of its VCO locked to its reference, with the ratio of the output frequency to the reference frequency exact and controlled by the N and R divider parameters of the PLL. This allows the frequency of the flywheel oscillator 402 to be set to an exact multiple (fractional, in this case, since w a fractional-N loop is used and the value of N includes a fraction with arbitrary resolution).

The control switch 608 receives the switch control 614 input from the clock control 204, the analog tuning voltage 218 from the DAC 206 (as set by the voltage control 216), and the PLL set frequency control 604 from the Fractional-N PLL 604. The control switch 608 includes a module configured to receive the switch control 614 input from the clock control 204 in the event that the PLL fault indication 610 is received by the clock control 204.

Under normal Fractional-N PLL operation (i.e. the PLL fault indication 610 has not been received), the control switch selects the PLL set frequency control 604 as the flywheel oscillator 402 control, and the selected tune voltage 616 is therefore set using the FO 402 as part of the Fractional-N PLL 602.

In case of a fault in the HO 208 or the Fractional-N PLL 602, the clock control module 204 is coupled to and configured to monitor the Fractional-N PLL 602 and receive the PLL fault indication 610 from the Fractional-N PLL 602 if the Fractional-N PLL 602 is not operating within set parameters. When the PLL fault indication 610 is received by the clock control 204, the control switch 608 instead selects the analog tuning voltage 218 as the flywheel oscillator 402 control (via the voltage control 216 from the clock control 204 as received by the DAC 206). The flywheel oscillator 402 is then controlled via the DAC 206 instead of by the Fractional-N PLL 602. The Fractional-N PLL disciplined clock 600 then operates similarly to the prior art of FIG. 2, with the FO 402 in place of the HO 208.

The purpose of the Fractional-N PLL 602 is to replace the holdover oscillator control of FIG. 2 with a digital method, having no additional errors (unlike analog tuning of the prior art). The performance and accuracy of this method is limited only by the resolution of the fractional part of the N divider parameter. This is a digital parameter, and may therefore have essentially infinite resolution and vanishing error.

The net effect is similar to that of FIG. 2, in that the FO frequency 404 can be adjusted to minimize the time error between the external reference time signal 104 and the first counter time signal 224. But in this implementation, the 'tuning' is done digitally, which eliminates the analog tune errors inherent in the method of FIG. 4.

In the Fractional-N PLL disciplined clock 600 embodiment shown in FIG. 6, the actual value of the holdover oscillator frequency 226 can be known with digital precision and essentially unlimited resolution. In the embodiment shown in FIG. 4, the tune value sent to the digital-to-analog converter is known; but errors in the DAC 206 and its voltage reference, and non-linearities and other errors in the holdover oscillator tune input, all limit the usefulness of this information when estimating the actual holdover oscillator frequency 226.

Additionally, by implementing a 'backup' control of the flywheel oscillator 402 using the typical DAC 206 in the clock control module 204, along with the control switch 608, the holdover oscillator 208 is still eliminated as a critical point of failure in the Fractional-N PLL disciplined clock 600. When the HO 208 is operating normally, the control switch 608 selects the Fractional-N PLL 602 to control the flywheel oscillator 402. If a failure in the holdover oscillator 208 or the fractional-N PLL 602 is detected, the control switch 608 set the control to the 'backup' method using the DAC 206 to control the FO 402.

Figure 7:
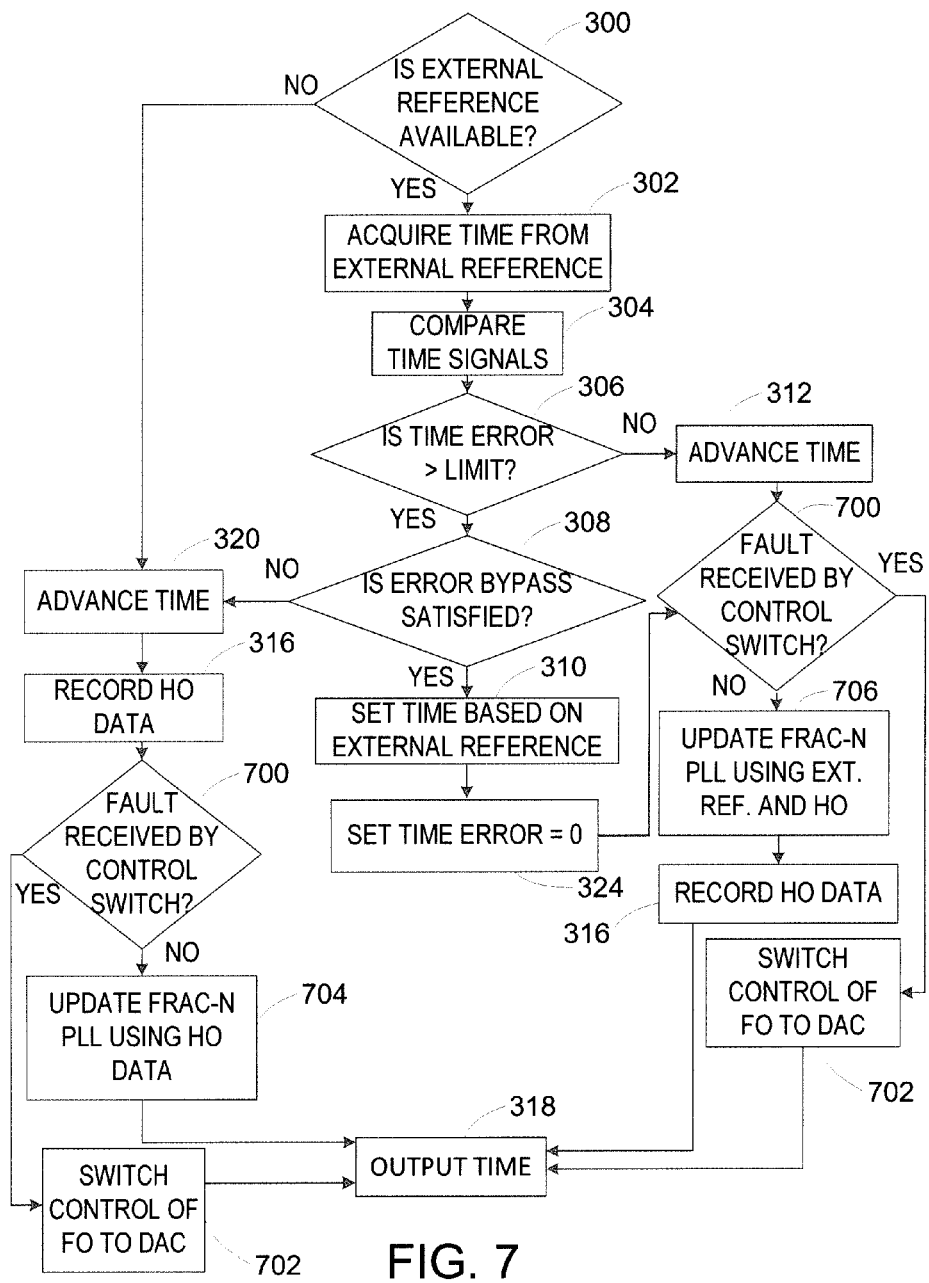
FIG. 7 is a process diagram of the holdover Fractional-N disciplined clock of FIG. 6.

Referring next to FIG. 7, the operational process of the Fractional-N PLL disciplined clock 600 of FIG. 6 is shown. Shown are the external reference available decision point 300, the acquire external reference time step 302, the compare time step 304, the FO time error decision step 306, the error bypass decision step 308, the external reference set time step 310, the reset time error step 324, the first advance time step 312, the record HO data step 316, the output time step 318, the second advance time step 320, a fault decision point 700, a DAC control step 702, an update PLL using HO step 704, and an update PLL using external reference and HO step 706.

The FIG. 7 process is generally similar to the process shown in FIG. 5, with the exception of the control updating steps 704, 706. Additionally, the method includes steps PLL fault decision point 700 and DAC control step 702 for determining if the Fractional-N PLL 602 is faulty whereby control of the FO 402 is switched to the DAC 206 if the fault is found.

Initially, in the external reference available decision point 300, the system determines if the external reference time signal 104 is available. If the external time reference signal is available, the process proceeds to the acquire external reference step 302. If the external reference time signal 104 is unavailable, the process proceeds to the second advance time step 320.

In the acquire external reference time step 302, the time comparator 202 obtains the external reference time signal 104 from the external reference 102. In the following step, the time error decision step 306, the time comparator 202 compares the external reference time signal 104, and the first counter time signal 224 (based from the FO frequency 404) and determines the time error 214 (as previously described in FIG. 2). If the time error between the first counter time signal 210 and the external reference 102 exceeds a certain limit, either set by the user or determined by the clock control module 204, the process proceeds to the error bypass decision step 308. If the FO-external reference time error does not exceed the limit, the process proceeds to the first advance time step 312.

During the first advance time step 312, the first counter 210 advances the time based on the FO frequency 404 received from the FO 402. The process then proceeds to the PLL fault decision point 700.

In the PLL fault decision point 700, if the Fractional-N PLL fault has been received by the clock control module 204, the process proceeds to the DAC control step 702. In the DAC control step 702, the control switch 608 switches control of the FO 402 from the Fractional-N PLL 602 to control through the DAC 206 as previously described in FIG. 6. The clock control module 204 now controls the FO frequency 404 using the voltage control 216 and DAC 206. The process then proceeds to the output time step 318, and the advanced time is output as previously shown in FIGS. 3 and 5.

If the fault 610 has not been received, the process proceeds to the update PLL using external reference and HO step 706, and the control switch 608 continues to use the PLL set frequency control 604 as the selected tune voltage 616. The parameters of the Fractional-N PLL 602 are updated by the clock control module 204 using the time error output 214. The process then proceeds to the record HO data step 316.

During the record HO data step 316, data 220 including HO performance and environmental factors (via one or more sensors, as applicable) are recorded, as previously described in FIG. 2. The process then proceeds to the output time step 318, where the first counter 210 outputs the time signal 224.

In the case where the time error exceeds the limit, the process proceeds instead to the error bypass decision step 308. During the error bypass decision step 308, the clock control module 204 determines if the error bypass threshold, as previously described in FIG. 2, is satisfied. If the error bypass threshold is not satisfied, the external reference 102 may be experiencing momentary errors and should not be used to set the time. The process would then proceed to the second advance time step 320. If the error bypass is satisfied, the process proceeds to the external reference set time step 310.

During the external reference set time step 310, the external reference 102 is used to adjust the first counter 210 to match the external reference time signal 104 (the counter adjustment 222 as shown in FIG. 6). The process then proceeds to the reset time error step 324, where the time error value is reset to 0, since the first counter time signal 224 has been reset to match the external reference time signal 104. The process then proceeds to the PLL fault decision step, and continues through the rest of the process as before.

If the error bypass threshold is not satisfied, or if during the initial external reference available decision point 300 the external reference time signal 104 is found to be unavailable, the process continues to the second advance time step 320. During the second advance time step 320, the first counter time signal 224 is advanced using the FO frequency 404. The process then proceeds to the PLL fault decision point 700.

As previously described, in the PLL fault decision point 700, if the Fractional-N PLL fault 610 has been received by the clock control module 204, the process proceeds to the DAC control step 702. In the DAC control step 702, the control switch 608 switches control of the FO 402 from the Fractional-N PLL 602 to control through the DAC 206 as shown in FIG. 6 (via the voltage control 216 and the analog tuning voltage 218, as selected and passed on to the flywheel oscillator 402 via the selected tune voltage 616). The process then proceeds to the output time step 318, and the advanced time is output as previously shown in FIGS. 3 and 5.

If the fault has not been received, the process in this case proceeds to the update PLL using HO step 704, and the control switch 608 continues to use the PLL set frequency control 604 as the selected tune voltage 616. During this step, the parameters of the Fractional-N PLL 602 are updated using only the HO data 220. The process then proceeds to the record HO data step 316, where the HO data 220 is recorded, and then to the output time step 318 as previously described.

As previously described in FIG. 6, the overall process is similar to that shown in FIG. 5, with the change of the type of FO 402 control (based on the Fractional-N PLL 602 instead of the DAC 206 control), and the addition of the DAC 206 alternate clock control when the HO 208 or Fractional-N PLL 602 contains a fault.

Referring next to FIG. 8, an exemplary expected holdover uncertainty table 800 is shown. Shown are a plurality of holdover interval values 802 and a plurality of estimated uncertainty values 804.

As previous described in FIG. 2, recording actual data 220 of the measured HO performance (time error, or frequency offset, vs. time) allows estimation of the expected future uncertainty of the HO frequency 226 predictions, and the resulting time quality, with improved confidence.

A series of these estimates, for several intervals of interest (e.g., ranging from 15 minutes to 30 days) can be computed from time to time while the clock 106 is disciplined to the external reference 102. These estimates may be used while in holdover to estimate uncertainty during the holdover period, in real time. This information, often referred to as 'time quality,' can be provided by suitable means to the user of the time information generated by the clock 106. The expected holdover uncertainty table 800 as shown in FIG. 8 (tabulated over the several intervals of interest) can also be provided periodically or on request, either when the external reference 102 is usable or when in holdover. The exemplary expected holdover uncertainty table 800 includes a column of various holdover interval values 802, and a matching column of estimated uncertainty values 804 for the corresponding holdover interval value 802.

Some of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

While the invention herein disclosed has been described by means of specific embodiments, examples and applications thereof, numerous modifications and variations could be made thereto by those skilled in the art without departing from the scope of the invention set forth in the claims.

What is claimed is:

1. A disciplined clock system comprising:
   a flywheel oscillator receiving a tuning voltage and outputting a flywheel oscillator frequency to a first counter responsively outputting a first counter time signal, wherein the flywheel oscillator frequency is controlled by the tuning voltage;
   a holdover oscillator outputting a holdover oscillator frequency to a second counter responsively outputting a second counter time signal;
   a time comparator module communicatively coupled to an external reference, the first counter, and the second counter, the time comparator module configured to perform the steps of:
      receive the first counter time signal, the second counter time signal, and an external reference time signal from the external reference;
      compare the external reference time signal, the first counter time signal and the second counter time signal, wherein a difference between two signals is a time error value; and responsively output a time error output including at least one time error value;
   a clock control module coupled to the time comparator module and receiving the time error output and performance data from at least one of the holdover oscillator and at least one sensor, and responsively outputting a voltage control, wherein the clock control module is further configured to estimate a future holdover interval performance of the holdover oscillator by performing the steps of:
      recording a historical performance of the holdover oscillator,
      comparing the historical performance with an actual performance,
      determining an error in response to the comparing of the historical performance with the actual performance, and
      determining error bounds of a projected performance in response to the determining of the error; and
   a digital-to-analog converter coupled to the clock control module and the flywheel oscillator, the digital-to-analog converter receiving the voltage control and responsively outputting the tuning voltage to the flywheel oscillator;
   wherein the time error output is used by the clock control module to determine the voltage control when the external reference time signal is reliable; and
   wherein the time error output and the performance data are used by the clock control module to determine the voltage control when the external reference time signal is unreliable.

2. The disciplined clock system of claim 1, the clock control module further comprising at least one processor coupled to at least one non-transitory memory.

3. The disciplined clock system of claim 1, the clock control module further comprising a means-to-set-time function receiving the external reference time signal and responsively adjusting the first counter time signal to match the external reference time signal.

4. The disciplined clock system of claim 3, wherein the first counter time signal is adjusted when a flywheel oscillator time error comprising the difference between the external reference time signal and the first counter time signal exceeds a flywheel oscillator time error limit.

5. The disciplined clock system of claim 1, further comprising at least one of an application and a display configured to receive the first counter time signal.

6. The disciplined clock system of claim 1, wherein the holdover oscillator is selected from the group consisting of temperature-compensated crystal oscillators, oven-controlled crystal oscillators, and atomic standards.

7. The disciplined clock system of claim 1, wherein the unreliability of the external reference time signal includes unavailability of the external reference time signal.

8. The disciplined clock system of claim 1, wherein the clock control module is further configured to estimate a future holdover interval performance of the holdover oscillator.

9. A method for operating a disciplined clock system, comprising the steps of:
   determining whether an external reference time signal is available;
   determining, when the external reference time signal is available, whether the external reference time signal is reliable;
   outputting a first counter time signal from a first counter coupled to a flywheel oscillator;
   outputting a second counter time signal from a second counter coupled to a holdover oscillator;
   outputting a time error signal comprising the steps of:
      comparing the external reference time signal, the first counter time signal and the second counter time signal, wherein a difference between two signals is a time error value;

responsively outputting a time error output including at least one time error value;
estimating a future holdover interval performance of the holdover oscillator by performing the steps of:
recording a historical performance of the holdover oscillator,
comparing the historical performance with an actual performance,
determining an error in response to the comparing of the historical performance with the actual performance, and
determining error bounds of a projected performance in response to the determining of the error;
updating a voltage control of the flywheel oscillator by a clock control module, the voltage control based at least on the time error output;
recording at least one of current holdover oscillator data and sensor data from at least one sensor; and
outputting the first counter time signal from the first counter.

10. The method for operating the disciplined clock system of claim 9, further comprising the step of adjusting the first counter time signal when a flywheel oscillator time error comprising the difference between the external reference time signal and the first counter time signal exceeds a flywheel oscillator time error limit.

11. The method for operating the disciplined clock system of claim 9, further comprising the steps of:
outputting a holdover time signal from the first counter when the external reference time signal is unavailable, the outputting of the holdover time signal comprising the steps of:
comparing the first counter time signal and the second counter time signal, wherein the difference between the first counter time signal and the second counter time signal comprises the time error output;
updating control of the flywheel oscillator by the clock control module based at least on the time error output and at least one of recorded holdover oscillator data and sensor data from at least one sensor; and
outputting the holdover time signal from the first counter.

12. The method for operating the disciplined clock system of claim 9, further comprising the steps of:
outputting a holdover time signal from the first counter when the external reference time signal is unreliable, the outputting of the holdover time signal comprising the steps of:
comparing the first counter time signal and the second counter time signal, wherein the difference between the first counter time signal and the second counter time signal comprises the time error output;
updating control of the flywheel oscillator by the clock control module based at least on the time error output and recorded holdover oscillator data; and
outputting the holdover time signal from the first counter.

13. The method for operating the disciplined clock system of claim 9, further comprising the step of estimating a future holdover interval performance of the holdover oscillator.

14. A disciplined clock system comprising:
a phase-locked loop system comprising:
a flywheel oscillator controlled by the phased-locked loop system, wherein a flywheel oscillator frequency is output to a first counter;
a holdover oscillator outputting a holdover oscillator frequency, the holdover oscillator frequency used by the phase-locked loop system to control the flywheel oscillator;
performance data comprising at least one of holdover oscillator data from the holdover oscillator and sensor data from at least one sensor;
at least one phase-locked loop parameter used to control the flywheel oscillator;
the first counter receiving the flywheel oscillator frequency and responsively outputting a first counter time signal;
a time comparator module communicatively coupled to an external reference and the first counter, the time comparator module configured to perform the steps of:
receiving the first counter time signal and an external reference time signal from the external reference;
comparing the external reference time signal and the first counter time signal, wherein a difference between two signals is a time error value; and
responsively outputting a time error output including at least one time error value; and
a clock control module coupled to the time comparator module and configured to receive the performance data, the time error output and responsively output the at least one phase-locked loop parameter to the phase-locked loop system, wherein the clock control module is further configured to estimate a future holdover interval performance of the holdover oscillator by performing the steps of:
recording a historical performance of the holdover oscillator,
comparing the historical performance with an actual performance,
determining an error in response to the comparing of the historical performance with the actual performance, and
determining error bounds of a projected performance in response to the determining of the error;
wherein the time error output is used by the clock control module to determine at least one phase-locked loop parameter when the external reference time signal is reliable; and
wherein the performance data are used by the clock control module to determine the at least one phase-locked loop parameter when the external reference time signal is unreliable.

15. The disciplined clock system of claim 14, the clock control module further comprising at least one processor coupled to at least one non-transitory memory.

16. The disciplined clock system of claim 14, the clock control module further comprising a means-to-set-time function receiving the external reference time signal and responsively adjusting the first counter time signal to match the external reference time signal.

17. The disciplined clock system of claim 16, wherein the first counter time signal is adjusted when a flywheel oscillator time error comprising the difference between the external reference time signal and the first counter time signal exceeds a flywheel oscillator time error limit.

18. The disciplined clock system of claim 14, further comprising at least one of an application and a display configured to receive the first counter time signal.

19. The disciplined clock system of claim 14, wherein the holdover oscillator is selected from the group consisting of temperature-compensated crystal oscillators, oven-controlled crystal oscillators, and atomic standards.

20. The disciplined clock system of claim 14, wherein the unreliability of the external reference includes unavailability of the external reference time signal.

21. The disciplined clock system of claim 14, wherein the clock control module is further configured to estimate a future holdover interval performance of the holdover oscillator.

22. The disciplined clock system of claim 14, further comprising:
  a digital-to-analog converter coupled to the flywheel oscillator and to the clock control module; and
  a control switch of the clock control module, the control switch configured to receive a fault from the phase-locked loop system and responsively change control of the flywheel oscillator from the phase-locked loop system to the digital-to-analog converter.

23. The disciplined clock system of claim 14, wherein the phase-locked loop system is a Fractional-N phase-locked loop system.

24. A method for operating a disciplined clock system, comprising the steps of:
  determining whether an external reference time signal is available;
  determining, when the external reference time signal is available, whether the external reference time signal is reliable;
  outputting a first counter time signal from a first counter coupled to a flywheel oscillator;
  outputting a time error output when the external reference time signal is reliable comprising the steps of:
    comparing the external reference time signal and the first counter time signal, wherein a difference between two signals is a time error value; and
    responsively outputting a time error output including at least one time error value;
  receiving of the time error output by a clock control module;
  outputting by the clock control module of at least one phase-locked loop parameter to a phase-locked loop including the flywheel oscillator and a holdover oscillator, whereby the flywheel oscillator is controlled at least by the at least one phase-locked loop parameter and the holdover oscillator, wherein the clock control module is further configured to estimate a future holdover interval performance of the holdover oscillator by performing the steps of:
  recording a historical performance of the holdover oscillator,
  comparing the historical performance with an actual performance,
  determining an error in response to the comparing of the historical performance with the actual performance, and
    determining error bounds of a projected performance in response to the determining of the error;
  recording at least one of current holdover oscillator data and sensor data from at least one sensor; and
  outputting the first counter time signal from the first counter.

25. The method for operating a disciplined clock system of claim 24, further comprising the steps of:
  determining a flywheel oscillator time error value comprising the difference between the external reference time signal and the first counter time signal; and
  resetting the first counter to match the external reference time signal if the flywheel oscillator time error value exceeds a flywheel oscillator time error limit.

26. The method for operating the disciplined clock system of claim 24, further comprising the steps of:
  outputting a holdover time signal from the first counter when the external reference time signal is unreliable, the outputting of the holdover time signal comprising the steps of:
    updating control of the flywheel oscillator by the clock control module based on at least one of recorded holdover oscillator data and the sensor data from the at least one sensor; and
    outputting the holdover time signal from the first counter.

27. The method for operating the disciplined clock system of claim 26, wherein the unreliability of the external reference time signal includes unavailability of the external reference time signal.

28. The method for operating the disciplined clock system of claim 24, further comprising the steps of:
  receiving, by a control switch of the clock control module, of a fault indication from the phase-locked loop system;
  switching control of the flywheel oscillator from the phase-locked loop system to a digital-to-analog converter receiving a voltage control from the clock control module and outputting a analog tuning voltage to the flywheel oscillator, whereby a flywheel oscillator frequency of the flywheel oscillator is controlled.

29. The method for operating the disciplined clock system of claim 24, further comprising the step of estimating a future holdover interval performance of the holdover oscillator.

30. A disciplined clock system comprising:
  a flywheel oscillator receiving a tuning voltage and outputting a flywheel oscillator frequency to a first counter responsively outputting a first counter time signal, wherein the flywheel oscillator frequency is controlled by the tuning voltage;
  a holdover oscillator outputting a holdover oscillator frequency to a second counter responsively outputting a second counter time signal;
  a time comparator module communicatively coupled to an external reference, the first counter, and the second counter, the time comparator module configured to perform the steps of: receive the first counter time signal, the second counter time signal, and an external reference time signal from the external reference; compare the external reference time signal, the first counter time signal and the second counter time signal, wherein a difference between two signals is a time error value; and responsively output a time error output including at least one time error value;
  a clock control module coupled to the time comparator module and receiving the time error output and performance data from at least one of the holdover oscillator and at least one sensor, and responsively outputting a frequency control, wherein the clock control module is further configured to estimate a future holdover interval performance of the holdover oscillator by performing the steps of:
    recording a historical performance of the holdover oscillator,
    comparing the historical performance with an actual performance,
    determining an error in response to the comparing of the historical performance with the actual performance, and
    determining error bounds of a projected performance in response to the determining of the error; and a fractional-N loop coupled to the clock control module, the holdover oscillator and the flywheel oscillator, the fractional-N loop receiving the frequency control and responsively outputting the tuning voltage to the flywheel oscillator;

wherein the time error output is used by the clock control module to determine the frequency control when the external reference time signal is reliable; and wherein the time error output and the performance data are used by the clock control module to determine the frequency control when the external reference time signal is unreliable; and wherein the flywheel oscillator frequency is controlled by the fractional-N loop so that the ratio between the flywheel oscillator frequency and the holdover oscillator frequency is determined exactly by the frequency control.

31. The disciplined clock system of claim 30, the clock control module further comprising at least one processor coupled to at least one non-transitory memory.

32. The disciplined clock system of claim 30, the clock control module further comprising a means-to-set-time function receiving the external reference time signal and responsively adjusting the first counter time signal to match the external reference time signal.

33. The disciplined clock system of claim 32, wherein the first counter time signal is adjusted when a flywheel oscillator time error comprising the difference between the external reference time signal and the first counter time signal exceeds a flywheel oscillator time error limit.

34. The disciplined clock system of claim 30, further comprising at least one of an application and a display configured to receive the first counter time signal.

35. The disciplined clock system of claim 30, wherein the holdover oscillator is selected from the group consisting of temperature-compensated crystal oscillators, oven-controlled crystal oscillators, and atomic standards.

36. The disciplined clock system of claim 30, wherein the unreliability of the external reference time signal includes unavailability of the external reference time signal.

37. The disciplined clock system of claim 30, wherein the clock control module is further configured to estimate a future holdover interval performance of the holdover oscillator.

* * * * *